United States Patent
Woudenberg

(10) Patent No.: US 7,322,688 B2
(45) Date of Patent: Jan. 29, 2008

(54) JETTABLE INK

(75) Inventor: Richard C. Woudenberg, Keene, NH (US)

(73) Assignee: Markem Corporation, Keene, NH (US)

( * ) Notice: Subject to any disclaimer, the term of this patent is extended or adjusted under 35 U.S.C. 154(b) by 56 days.

(21) Appl. No.: 11/058,777

(22) Filed: Feb. 16, 2005

(65) Prior Publication Data

US 2005/0195265 A1 Sep. 8, 2005

Related U.S. Application Data

(60) Provisional application No. 60/549,645, filed on Mar. 3, 2004.

(51) Int. Cl.
*G01D 11/00* (2006.01)
(52) U.S. Cl. .................. 347/100; 347/102; 347/101
(58) Field of Classification Search ............. 347/102, 347/101, 100, 95, 96; 106/31.13, 31.6, 31.27; 523/160
See application file for complete search history.

(56) References Cited

U.S. PATENT DOCUMENTS

| | | | |
|---|---|---|---|
| 5,411,768 A * | 5/1995 | Knell et al. | 523/427 |
| 6,207,728 B1 * | 3/2001 | Sekiguchi et al. | 522/83 |
| 6,232,361 B1 * | 5/2001 | Laksin et al. | 106/31.6 |
| 7,011,699 B2 * | 3/2006 | Yamanouchi et al. | 106/31.13 |
| 2003/0134124 A1 * | 7/2003 | Ochiai | 428/413 |

OTHER PUBLICATIONS

International Search Report.

* cited by examiner

*Primary Examiner*—Manish S. Shah
(74) *Attorney, Agent, or Firm*—Fish & Richardson P.C.

(57) ABSTRACT

A printing method includes printing an ultraviolet light curable jettable ink including a colorant, a photoinitiating system, and cationic reagent onto a substrate provide a marking, and exposing the marking to ultraviolet radiation after at least two second. The ultraviolet light curable inkjet ink having Brookfield viscosity of between about 1 and 50 centipoise at printing temperature, and between about 170 and 500 centipoise at a shear rate of 20 $S^{-1}$ and at a temperature of about 20° C.

39 Claims, No Drawings

JETTABLE INK

CLAIM OF PRIORITY

This application claims priority under 35 USC §119(e) to U.S. patent application Ser. No. 60/549,645, filed on Mar. 3, 2004, the entire contents of which are hereby incorporated by reference.

BACKGROUND

The invention relates to jettable inks for ink jet printing.

During ink jet printing, the ink is ejected, generally at elevated temperature, through a component of a printhead, for example, an array of nozzles, onto a substrate. In some instances, the ejecting is followed by a curing step as a means to control flow. One method of curing involves exposing to ultraviolet (UV) radiation an ink that contains reactive reagents that polymerize upon exposure to UV radiation. Typically, the ink is exposed to UV radiation within milliseconds of printing on the substrate. The rapid exposure to UV radiation is further used to control dot gain and is known as pinning.

SUMMARY

Generally, the invention relates to UV curable jettable inks including a cationic reagent, for example a cationic monomer. The term "cationic reagent," as used herein, is a chemical, which upon exposure to a UV irradiated cationic photoinitiating system, polymerizes.

In one aspect, the invention features a method of printing. The method includes ink jet printing a UV curable ink comprised of a colorant and a cationic reagent, onto a substrate resulting in a mark, and exposing the mark to UV radiation after at least two seconds to cure the printed ink. Accordingly, the method provides a means of printing UV curable jettable inks that avoids the need to use pinning and can also be used with in line printing and curing. The term "mark" as used herein is a print, image, or graphic induced by an ink delivered by a plurality of ink jet nozzles, which is referred to as ink jet printing.

Specific embodiments can include one or more of the following features. The marking is exposed to UV radiation only after 5 seconds e.g., 10 seconds, 20 seconds, 30 seconds, 1 minute, 5 minutes, 10 minutes, 30 minutes, 60 minutes, 90 minutes, 5 hours, 10 hours, 16 hours, or 24 hours. In some instances the marking is cured as part of a batch curing process involving a plurality e.g., 2, 5, 10, 25, or 50 of the substrates. The substrate can be a printed circuit board (PCB), for example a circuit board (e.g., from Vermont Circuits, Inc., part number 5454, of Brattleboro, Vt.).

In another aspect, the invention features a UV curable jettable ink that includes a colorant and a cationic reagent where the ink has and ASTM 3363 pencil hardness test value of at least 2H e.g., at least 3H or at least 4H on a printed circuit board substrate.

In another aspect, the invention features a UV curable jettable ink including a colorant and a cationic reagent where the ink has a viscosity of about 9 centipoises to about 15 centipoises at about 65° C. to about 72° C. (e.g., between about 10 centipoises to about 12 centipoises at about 68° C.) as measured using a Brookfield viscometer. At jetting temperature, optimal jetting viscosity is generally based on the print head being used and is typically specified by the print head manufacturer.

In another aspect, the ink can have a viscosity at a shear rate of 20 s$^{-1}$ and a temperature of about 20° C. of between about 170 centipoises to about less than 500 centipoises. Additionally, the ink can have a viscosity at a shear rate of 1000 s$^{-1}$ and a temperature of 20° C. of between about 100 centipoises and 270 centipoises (as measured on a TA Instruments AR2000ETC, test described below).

In another aspect, the invention features a UV curable jettable ink composition that includes a colorant, a cationic reagent, and a rheology modifying additive including a hydroxy moiety, for example, stearyl alcohol; or a diol such as 1,10-decanediol (e.g., Speziol C10/2 available from Cognis Corp. USA, Cincinnati, Ohio), 1,12-stearyldiol (Speziol C18/2 available from Cognis Corp. USA, Cincinnati, Ohio), or a tallow glyceride (e.g., Tallow Glyceride 060 available from Koster Keunen, Inc. of Watertown, Conn.).

Specific embodiments of the inks can include one or more of the following features. The cationic reagent may be an epoxy monomer such as bis-(3,4-epoxycyclohexyl)adipate (e.g. UVR 6128 from Dow Chemical Co. of Midland, Mich.), 1,4-butanediol diglycidylether, or neopentyl glycol diglycidylether. The ink can include, for example, more than one cationic reagent (e.g., 2, 3, or more). The ink can include, for example, a rheology modifying additive. Examples of rheology modifying additives include additives such as hydrogenated castor oil and beeswax. In some instances, the rheology modifying additives can include hydroxy moieties that can take place in the polymerization process of the cationic reagents (e.g., epoxy monomers). Some examples of hydroxy containing rheology modifiers include alcohols such as stearyl alcohol and glyceryl behenate as well as polyols, for example diols, such as 1,10-decanediol, 1,12-stearyldiol, and Tallow Glyceride 060. The ink preferably includes a photoinitiator system, for example, a photoacid generator including a mixture of triarylsulfonium hexafluorophosphate salts (e.g., Cyracure UVI-6992) such as those available from Union Carbide (a subsidiary of the Dow Chemical Company. (While reference is made to photoinitiator UVI 6992 this is chemically the same as UVI 6990, which is produced using a slightly different and lower cost processes.) The photoinitiation system can be formulated with or without a sensitizer, for example, a UV sensitizer such as 9,10-diethoxy anthracene, 2-ethyl-9,10-dimethoxyantrhacene, or perylene. The ink can include about 60% to about 90% by weight of cationic reagent, about 3% to about 7.5% by weight of rheology modifying additive (e.g., a hydroxy containing rheology modifier), and about 0.5% to about 30% by weight of colorant. In some instances, the cationic reagent is used to disperse the colorant.

In another aspect, the invention includes a method of printing one of the inks described above.

The invention also includes a substrate such as a PCB, for example a Vermont Circuit Board, having a mark from one of the above described inks.

Other features, objects, and advantages of the invention will be apparent from the description and from the claims.

DETAILED DESCRIPTION

An example of a preferred ink includes one or more cationic epoxy-containing reagents that polymerize with exposure to UV radiation, a rheological modifying additive, a colorant, and a photoinitiating system.

Cationic Reagents

A reagent can include a monomer and/or an oligomer or a reactive side group on a polymer chain (e.g., epoxy side groups). Epoxy containing monomers are moieties that include at least one epoxide group. In many instances, the epoxy containing monomer includes two or more epoxide groups. Examples of epoxy containing monomers include cycloaliphatic epoxy compounds such as bis-(3,4-epoxycyclohexyl)adipate, 3,4-epoxycyclohexyl-methyl-3,4-epoxycyclohexane carboxylate, and 7-Oxa-bicyclo[4.1.0]heptane-3-carboxylic acid 7-oxa-bicyclo[4.1.0]hept-3-ylmethyl ester. Epoxy containing monomers also include ether derivatives including diol derivatives such as 1,4-butanediol diglycidylether and neopentyl glycol diglycidylether. Other epoxy containing ether derivatives include glycidyl ethers such as n-butyl glycidyl ether, distilled butyl glycidyl ether, 2-ethylhexyl glycidyl ether, C8-C10 aliphatic glycidyl ether, C12-C14 aliphatic glycidyl ether, O-cresyl glycidyl ether, P-tertiary butyl phenyl glycidyl ether, nonyl phenyl glycidyl ether, phenyl glycidyl ether, cyclohexanedimethanol diglycidyl ether, polypropylene glycol diglycidyl ether, poly glycol diglycidyl ether, dibromo neopentyl glycol diglycidyl ether, trimethylopropane triglycidyl ether, castor oil triglycidyl ether, propoxylated glycerin triglycidyl ether, sorbitol polyglycidyl ether, glycidyl ester of neodecanoic acid, and glycidyl amines such as epoxidized meta-xylenediamine.

The epoxy monomer can have a molecular weight, for example, of about 125 atomic mass units (a.m.u.) to about 500 a.m.u., and a viscosity, for example, of between about 1.1 centipoises to about 20,000 centipoises at a temperature of about 25° C. Monomers of higher molecular weight may also be used, preferably if blended with another monomer of lower molecular weight, for example, a monomer having a molecular weight of 10,000 a.m.u. blended with a monomer of 125 a.m.u. All molecular weights herein are listed in a.m.u., and all viscosities are measured using a Brookfield DV-II viscometer, a SC418 spindle, a Brookfield Thermosel for temperature control, generally at 60, 30, or 12 RPM spindle speed, which is dependent on the viscosity of the sample being tested.

In some embodiments, the ink includes two or more epoxy monomers, each having a different viscosity. A low viscosity monomer can be used as a diluent with a higher viscosity monomer to provide the desired rheological profile for the ink. When two epoxy monomers are used, the viscosity of the first epoxy monomer can be, for example, between about 0.1 and about 19 centipoises at 25° C. and the viscosity of the second epoxy monomer can be, for example, between about 19 centipoises and about 20,000 centipoises at 25° C. Examples of the lower viscosity monomers include 1,4-butanediol diglycidylether, neopentyl glycol diglycidylether, and n-Butyl glycidyl ether available as Erisys GE-5 from CVC Specialty Chemicals.

Preferred inks include at least about 40%, more preferably from about 60% to about 90%, by weight of the epoxy monomers. In some embodiments, the inks include greater than or equal to about 50%, 60%, 70%, or 80% by weight of the epoxy monomers. In some embodiments, the inks include less than or equal to about 95% by weight of the epoxy monomers.

Rheological Modifying Additives

Examples of rheological modifying additives include additives that can participate during the UV polymerization of the cationic reagents (e.g., monomers). Examples of rheological modifying additives include hydrogenated cator oil, beeswax, and other additives that include hydroxy containing moieties such as monoalcohols, diols, and glyceryls. Examples of monoalcohols include stearyl alcohol (available from Aldrich Chemical, Milwaukee, Wis.) and Unilin 350 (available from Petrolite of Sugar Land, Tex.). Examples of diols include 1,12-stearyldiol (available as Speziol 18/2 from Cognis Corp. USA Cincinnati, Ohio), 1,10-decanediol (available as Speziol 10/2 from Cognis Corp. USA Cincinnati, Ohio), or di-trimethylolpropane. Examples of glyceryls include tallow glycerides. Using a hydroxy functional rheological modifier can reduce the amount of unreactive material in the ink, potentially improving the final film properties.

Other examples rheological modifying additives include compounds such as erucyl stearamide and ethylene glycol distearate.

In general the ink can include, for example, from 1% to up to 30%, for example, from 3% to 7% of Theological modifier.

Colorants

The colorant may be a pigment or a dye. Preferred inks can include, for example, from about 0.5% to about 30%, more preferably from about 3% to about 20%, by weight of the colorant. Depending on applications, the inks may contain minimal colorant amounts to provide optical density.

A wide variety of organic and inorganic pigments, alone or in combination, may be selected for use in the ink. The pigment particles are preferably sufficiently small to permit free flow of the ink through an ink jet printing device. The particle sizes are preferably selected to provide good dispersion stability.

The pigment can be black, cyan, magenta, yellow, red, blue, green, brown, or a mixture thereof. Examples of suitable pigments include pigment blacks 7, carbon black, graphite; and pigment white titanium dioxide. Additional examples are disclosed in, e.g., U.S. Pat. No. 5,389,133, which is incorporated by reference herein. The pigment may also have a modifying group on its surface, such as an oxygen-containing functionality (e.g., a carboxyl or phenol group).

White inks can be made using a titania dispersion. The titania dispersion may include, for example, a blend of titania particles having a surface area of between about 8 and about 14 meters squared per gram. The primary particles size of the titania may be between about 190 and 410 nanometers. The titania particles are preferably dispersed into a concentrate using a combination of monomer and dispersant as the dispersing aid, which can result, for example, in about 60% to about 70% by weight titania. However, other concentrations can also be suitable, for example, a titania concentration of about 50% by weight.

Alternatively or in addition to the pigment, the inks can contain a dye. Suitable dyes include, but are not limited to, Orasol Pink 5BLG, Black RLI, Blue 2GLN, Red G, Yellow 2GLN, Blue GN, Blue BLN, Black CN, and Brown CR (all available from Ciba-Geigy, Inc., Mississauga, Ontario); Morfast Blue 100, Red 101, Red 104, Yellow 102, Black 101, and Black 108 (all available from Morton Chemical Company, Ajax, Ontario); and a mixture thereof. Additional examples include those disclosed in, e.g., U.S. Pat. No. 5,389,133, which is incorporated by reference herein.

Mixtures of colorants may be employed, if necessary, including mixtures of pigments, mixtures of dyes, and mixtures of one or more pigments with one or more dyes.

Photoinitiating Systems

A photoinitiating system e.g., a blend capable of producing cations, initiates polymerization reactions upon UV irradiation. The photoinitiating system generally initiates a cationic reaction, for example a ring-opening of an epoxy moiety, to form a reactive cationic species that attacks and opens another reactive species, e.g., an epoxy monomer.

The photoinitiating system can include a photoinitiator with or without a photosensitizer. In general, each component is fully soluble in the monomers and/or diluents described above. The photoinitiator generates strong acids upon UV exposure. Examples of photoinitiators include arylsulfonium salts (e.g., UVI 6992 and UVI 6974) such as mixed triarylsulfonoum hexafluoroantimonate or hexafluorophosphate, iodonium salts (e.g., Deuteron UV 2275 available from Deuteron GmbH, Achim Germany; Rhodorsil 2076 available from Rhodia, Lyon, France; UV9385C available from General Electric, Waterford, N.Y.; Bis(t-butylphenyl)iodonium hexafluorophosphate) available from Hampford Research, Inc. of Stratford, Conn.; and Irgacure 250 available from Ciba Specialty Chemicals Corp. of Basel, Switzerland), ferrocenium salts, and diazonium salts.

Rutile tiatania, commonly used in white inks and coatings, absorbs very strongly throughout the UV radiation spectrum, resulting in shielding of UV radiation deep into the coating. This leaves very little energy for photoacid generation. The workable range of photoacid generators can be extended into longer wavelengths by using sensitizing materials.

A sensitizer is a molecule that absorbs energy, and then transfers the energy to the photoacid generator. The sensitizer can be a substance that either increases the rate of a photoinitiated polymerization reaction or shifts the wavelength at which the polymerization reaction occurs. Examples of photosensitizers include, but are not limited to perylene, 2-ethyl-9,10-dimethoxyanthracene, 9,10-diethoxyanthracene, and isopropylthioxanthone.

As an example, a jettable ink composition may include 0.5-3% by weight of the photoinitiator and about 0.01-1.0% by weight of the photosensitizer, for example about 2% by weight of the photoinitiator and about 0.1% by weight of the photosensitizer.

Other Ingredients

The pigmented jettable ink can also include a polymeric dispersant. The polymeric dispersant can assist in stabilizing the pigment in the jettable ink. The dispersant can, for example, prevent agglomeration of the pigment. The ink can include between about 1% and 10% by weight dispersant, e.g., about 3% and 8% by weight dispersant. The amount of dispersant required is generally based on the grams per meter squared of pigment.

Examples of dispersants include, but are not limited to, Solsperse 13,650, 13,940, 17,000, 24,000; Byk 108; Tego Dispers 700; UNIQEMA 5543; and EFKA 5244, 5207, 6750; which are all commercially available from Avecia; Byk Chemie; Tego Chemie; Zephryn Uniquema; and EFKA additives, respectively.

The selection of the dispersant depends on an ink composition including a vehicle and a pigment. The selected dispersant can be soluble in the vehicle, can lack volatility at an elevated temperature (e.g., 120° C.), and can have good affinity for the pigment. The dispersant can also include a synergist that aids dispersion.

In addition to or in place of a dispersant, a surfactant compound can be used. The surfactant compound can serve to alter the surface tension of the ink, and can be an anionic, cationic, nonionic or amphoteric surfactant compound, such as those described in McCutcheon's Functional Materials, North American Edition, Manufacturing Confectioner Publishing Co., Glen Rock, N.J., pp. 110-129 (1990). Examples of surfactants include copolymers such as SILWET® copolymers including Silwet L-7604, available from Crompton, OSi Specialties division. The copolymers are generally comprised of ethylene oxide, propylene oxide, and/or silicone. Other examples of surfactants include 3M FC430 available from 3M of St. Paul, Minn. and F50-100 available from DuPont Chemicals of Wilmington, Del.

Ink Properties

The ink has a viscosity that allows the ink to be ejected by an ink jet printer. The viscosity of the inks generally can be in the range of about 1 centipoise to about 50 centipoise (e.g., from about 5 centipoise to about 45 centipoise, or from about 7 centipoise to about 35 centipoise) at printing temperature.

The preferred ink has an ASTM 3363 pencil hardness test value, for example, of at least 2H, preferably 3H, more preferably 4H. For purposes of this application, the test should be conducted using a circuit board part number 5454, produced by Vermont Circuits, Inc. of Brattleboro, Vt., or an equivalent circuit board. The model 3363 Pencil Scratch Hardness Tester (from Paul N. Gardner Company, Inc, Pompano Beach, Fla.) includes a pencil lead holder carried on two rollers, the weight of which is so arranged that the pressure exerted by the flat pencil lead is approximately 300 grams. A test board is placed on a firm horizontal surface and a pencil is then held firmly against a solder mask at a 45 degree angle. Pencils grading from 4B (soft) to 9H (hard) can be used to grade the hardness of the cured mark.

The preferred ink passes a cross hatch adhesion test following a procedure outlined on pages 65-66 in the Paul N. Gardner 65$^{th}$ Anniversary catalog by Garner Company of Pompano Beach, Fla. The procedure follows the guidelines from ASTM D3359 and the tape used is Scotch Brand 600 from 3M Corporation.

A preferred ink also passes a Model 4000 Ball Bearing Scratch Test, which is performed using the following steps. An ink marking not exceeding a thickness of 20 microns is printed onto a substrate and cured. The marking is then tested under a ball bearing fixture of ¼ inch that is attached to an AATCC crock meter. A 200 g mass is affixed to the arm of the crock meter immediately behind the ball bearing. The marking is subjected to a number of double scratches, each double scratch being a full cycle of the crock meter starting from the resting position and returning to the resting position. Each double scratch is counted until the first visible sign of adhesion failure is seen or alternatively, until the count reaches fifty. In general, marking receiving a passing score can be subjected to at least 20 double scratches (i.e., rubs) before visible signs of adhesion failure. In general, the Ball Bearing Scratch Test is run in triplicate for each substrate with the count of double scratches (i.e., rubs) averaged.

A preferred ink also passes the peel strength tape test described in section 8.6.1 of Japanese Industrial Standard, Test methods for printed writing boards, JIS C 5012 (1993), the entire contents of which is incorporated herein by reference. In general, the test is performed on a printed board on which a marking is applied. The adhesive surface of the tape is attached to the cleaned surface of an ink marking over a length of 50 mm or more by pressing the tape such that no air bubbles remain. The tape is then quickly peeled in a direction perpendicular to the printed surface after a lapse of about 10 seconds. The marking is examined to determine whether the mark adheres to the tape using either a visual check or a magnifier.

Rheological Measurements

Viscosity measurements at various shear rates were accomplished using a TA Instruments AR2000 ETC (P/N: 543301.901 serial number AR2ETC0123), using a 40 mm parallel plate (part # 511400.901, serial number 984068), and a detachable sample plate: Peltier (part #531051.901, serial #2506025B). The temperature was held at 22° C. with the shear procedure as follows: pre conditioning at 10.00 1/sec for 5.00 minutes, peak hold step 1—hold shear at 20.00 1/sec for 1.00 minutes, peak hold step 2—hold shear at 1000 1/sec for 1.00 minutes, peak hold step 3—hold shear at 10.00 1/sec for 5.00 minutes.

Preparing Inks

To prepare a UV-curable liquid composition, one can combine all of the composition ingredients, heat the resulting combination, and if necessary, mill.

In some instances, the ink is prepared by blending all components except for the rheology modifier and pigment concentrate. Each clear sample and rheology modifier is heated to 80° C. The rheology modifier is then added to the mixture as a liquid to check for solubility, if no solubility issues are seen then the pigment concentrate is added.

In some embodiments, to prepare a radiation-curable jettable ink composition ingredients except for photoinitiating system components are combined; the resulting combination heated and milled. Photoinitiating system components are mixed with the liquefied combination; and the mixture is filtered.

To prepare pigmented inkjet inks, it is preferable to prepare a concentrate of the chosen pigment in one or more of the ink raw materials. Two advantages to the pigment concentrate are ease of pigment grinding and reduced process time.

In the pigment concentrate, the total number of pigment particles is increased, which allows for more particle-particle and particle-grinding media collisions, which in turn decreases the amount of time needed to reach the desired particle size. Additionally, in the concentrate the particles have higher odds of coming in contact with dispersant/surfactant molecules. These materials preferably adsorb onto the surface of the particles, e.g., so that the reduced particle size does not increase due to agglomeration. By increasing the odds of particle-dispersant collisions, the grind time can be reduced and the particle size stability can be increased.

To prepare a carbon black pigment concentrate, the amount of dispersant needed for the concentrate is calculated (the calculation can be based on the desired pigment particle size, the calculated pigment surface area (supplied by the pigment manufacturer), or both); the calculated amount of fluid vehicle and dispersant charged into an appropriate vessel; the vehicle and dispersant mixed until fully blended (some gentle heating may be necessary if the dispersant is a solid); the vehicle/dispersant mixture moved to a high shear mixer; the pigment slowly charged; and the just obtained pigment concentrate milled.

For a liquid ink, all liquid monomers and oligomers are mixed, and photoinitiators are added to the mixture. If the photoinitiators are solid, they are preferably fully dissolved in the mixture. Then, the pigment concentrate is added to obtain the liquid ink. If necessary, the ink is filtered through a 1 µm filter.

For a solid ink, all monomers and oligomers are heated, mixed, and photoinitiators are added to the liquefied mixture. If the photoinitiators are solid, they are preferably fully dissolved in the mixture. Then, the pigment concentrate is added to obtain the ink. If necessary, the ink is heated and filtered.

Printing and Curing Methods

A method of printing, e.g., ink jet printing, and curing an ink image includes printing a UV curable ink composition as described above on a substrate to form a marking, and curing the marking by exposure to UV radiation. In many instances, the marking is not exposed to UV radiation for at least 2 seconds (e.g., at least 5 seconds, at least 30 seconds, at least 1 minute, at least 5 minutes, at least 30 minutes, at least 90 minutes, at least 16 hours, or at least 24 hours). In some instances the markings are cured in a batch process.

A radiation line source can be used to provide a uniform area of radiation exposure. The line source may include an ultraviolet lamp (e.g., Fusion UV Inc. F300 irradiation with a D lamp and a half aluminum reflector). Other suitable printing and curing means may also be used, such as methods of printing described in: Leach, R. H., Pierce, R. J., The Printing Ink Manual, Blueprint (Chapman & Hall), 5$^{th}$ ed., 1993. An example of a printing system is Markem 4000 system available from Markem Corp., N.H.

The specific examples below are illustrative, and not intended to be limiting. All publications, patents, applications, and references cited herein are hereby incorporated by reference in their entirety.

EXAMPLES

Example 1

Epoxy Inks Including Hydrogenated Castor Oil as a Rheology Modifier

Ink compositions including UV curable cationic monomers were prepared by blending the components of each sample in a scintillation vial and uniformly heating the vial to 80° C. This allowed the hydrogenated castor oil to melt and be mixed with the other materials. All samples were compatible. Hand drawdowns were prepared using a #18 wire wound rod on small printed circuit board parts and cured at 5 fpm (Fusion F300, D-bulb, ½ elliptical aluminum reflector)

The formulations of the inks are shown in Table 1 below:

TABLE 1

Cationic Epoxy Monomer Inks Having an Rheology Modifier

| | A | B | C | D |
|---|---|---|---|---|
| Cyracure 6128 | 43% | 42.2% | 41.5% | 40.8% |
| Heloxy 68 | 43% | 42.2% | 41.5% | 40.8% |
| TiO2 (70%) dispersion | 12.3% | 12.1% | 11.9% | 11.7% |
| UVI-6974 | 1.6% | 1.7% | 1.7% | 1.7% |
| Perylene | 0.1% | 0.1% | 0.1% | 0.1% |
| Hydrogenated Castor Oil | 0% | 1.7% | 3.3% | 4.9% |
| BB crock meter double rubs | 20 | 3 | 13 | 20 |

All samples were tack free immediately after UV exposure and no surface wrinkling was observed. Cured samples were tested for adhesion using the Model 4000 Scratch ball bearing test. At the time of testing, a double rub of 20 was considered excellent, 10 and higher good and 9 or less a fail. Samples A and D had excellent scratch and sample B had good scratch performance. Sample B failed after only 3 double rubs.

Example 2

Epoxy Inks Including Hydroxy Containing Rheology Additives

Four rheology additives having hydroxyl functionality were chosen for evaluation in the epoxy monomer ink formulation: stearyl alcohol, Speziol C10/2, Speziol C18/2, and Di-trimethylolpropane. Hydroxyl groups participate in the UV polymerization of epoxies through chain transfer. Moreover, using a hydroxy functional rheology modifier can reduce the amount of unreactive material in the ink, potentially improving the final film properties. The formulations of the inks including hydroxyl containing rheology additives are shown in Table 2.

TABLE 2

Epoxy Inks Including Hydroxy Containing Rheology Additives

|  | 2A | 2B | 2C | 2D |
|---|---|---|---|---|
| Cyracure 6128 | 41.7% | 41.7% | 41.7% | 41.7% |
| Heloxy 68 | 41.7% | 41.7% | 41.7% | 41.7% |
| TiO2 (70%) dispersion | 12.2% | 12.2% | 12.2% | 12.2% |
| UVI-6974 | 1.7% | 1.7% | 1.7% | 1.7% |
| Perylene | 0.1% | 0.1% | 0.1% | 0.1% |
| Stearyl Alcohol | 2.6% |  |  |  |
| Speziol C10/2 |  | 2.6% |  |  |
| Speziol C18/2 |  |  | 2.6% |  |
| Di-TMP |  |  |  | 2.6% |

Each sample was prepared by blending all components except for the rheology modifier and pigment concentrate. Each clear sample and rheology modifier was then heated to 80° C. The rheology modifier was subsequently added to the mixture as a liquid to check for solubility, if no solubility issues were seen then colorant was added. Samples 2A, 2B, and 2C showed no solubility issues. Sample 2D however, was not fully dissolved At 80° C. the samples of 2A, 2B, and 2C were each drawn-down onto Vermont Circuit PCB substrate using a #18 wire wound rod (from Paul N. Gardner Company, Inc, Pompano Beach, Fla.). 2A demonstrated "gelling" instantly, 2B demonstrated no "gelling", and 2C demonstrated "gelling" but at a slower rate than 2A. Gelling is used herein to describe the process where the coating/ink transitions from jetting viscosity at elevated temperature to room temperature viscosity.

Additional drawdowns of 2A were prepared, cured, and tested for performance using the 4000 Scratch Ball Bearing Test. Values of 15-20 double rubs to reach failure were recorded.

Example 3

Increasing Percentage of Rheology Modifier

Ink composition 3A was loaded into the Nova (300 dpi) printhead (Spectra Corporation, Hanover, N.H.) and jetted at 68° C. The increase in the amount of rheology modifier, relative to the previous examples produced a higher quality image.

TABLE 3

Cationic Monomer Ink Including 5% by Weight of Rheology Modifier

|  | 3A |
|---|---|
| Cyracure 6128 | 39.3 |
| Erysis GE-21 | 39.3 |
| TiO2 (70%) dispersion | 14.3 |
| UVI-6974 | 2 |
| Perylene | 0.1 |
| Stearyl Alcohol | 5 |

*values are weight percent

Several marks of 3A were made on PCB's so that extensive adhesion testing could be performed, where 3A passed performance testing.

Example 4

Cationic Monomer Inks Including Glyceryl Behenate as a Rheological Modifier

In order to further explore alternative rheological additives, e.g., glyceryl behenate (commercially available as Comptrol 888 from Gattefosse), the ink formulations in Table 4 were prepared.

TABLE 4

Epoxy Monomer Ink Including Compritol 888 (Glyceryl Behenate)

|  | 4A | 4B | 5C |
|---|---|---|---|
| Cyracure 6128 | 41.44 | 42.29 | 39.72 |
| Erysis GE-21 | 31.38 | 32.02 | 35.98 |
| Titania (50%) dispersion | 20.11 | 20.51 | 19.25 |
| Compritol 888 | 5.02 | 3.08 | 3 |
| UVI-6974 | 2.00 | 2.05 | 2 |
| Perylene | 0.05 | 0.05 | 0.05 |

*Values are provided in percent by weight.

Several samples of both 4A and 4B were allowed to sit uncured for about 16 hours, without any observed print quality degradation.

5C has a viscosity at 65° C. showed a viscosity of 13.4 centipoise.

Example 5

Additional Ink Formulations

In addition to the ink formulations described above, other exemplary ink formulations are provided below. All numbers provided below refer to percent by weight.

In one instance, the ink formulation includes 41.67% Cyracure 6128, 37.75% Erisys GE-21, 3.25% UVI 6992, 13.33% $TiO_2$ Dispersion, 0.50% 9,10-diethoxy anthracene, 0.5% Silwet L-7604, and 3.00% Tallow Glycerides 060.

In another instance, the ink formulation includes 40.24% Cyracure 6128, 36.43% Erisys GE-21, 6.00% UVI 6992, 13.33% $TiO_2$ Dispersion, 0.50% 9,10-diethoxy anthracene, 0.50% Silwet L-7604, and 3.00% Tallow Glycerides 060.

In another instance, the ink formulation includes 39.32% Cyracure 6128, 35.60% Erisys GE-21, 3.25% UVI 6992, 13.33% $TiO_2$ Dispersion, 0.50% 9,10-diethoxy anthracene, 0.50% Silwet L-7604, and 7.50% Speziol C18/2.

In another instance, the ink formulation includes 41.68% Cyracure 6128, 37.74% Erisys GE-21, 3.25% UVI 6992, 10.83% $TiO_2$ Disp, 0.50% 9,10-diethoxy anthracene, 3.00% Silwet L-7604 and 3.00% of one of the following rheology additives: Compritol 888, Compritol HD5, or Tallow Glycerides 060.

Other embodiments are within the scope of the following claims. For example, other cationic monomers beside epoxy monomers can be used in the inks. Examples include vinyl ethers or a combination of vinyl ethers and epoxy monomers.

What is claimed is:

1. A method of ink jet printing comprising:
   jetting from an ink jet printer an ultraviolet light curable ink jet ink onto a substrate to apply a marking, the ultraviolet light curable ink jet ink having a Brookfield viscosity of between about 1 centipoise and about 50 centipoise at printing temperature, and between about 170 centipoise and about 500 centipoise at a shear rate of 20 s$^{-1}$ and at a temperature of about 20° C., the ultraviolet light curable ink jet ink comprising a colorant, a photoinitiating system, and a cationic reagent, wherein the cationic reagent is a chemical, which upon exposure to a UV irradiated cationic photoinitiating system, polymerizes;

waiting at least two seconds after applying the marking; and then exposing the marking to ultraviolet radiation.

2. The method of claim 1 wherein the substrate is a printed circuit board.

3. The method of claim 1 wherein the marking is not exposed to ultraviolet radiation for at least 30 seconds after application.

4. The method of claim 1 wherein the marking is cured as part of a batch curing process involving a plurality of the substrates.

5. The method of claim 1 wherein the cationic reagent is an epoxy reagent.

6. The method of claim 5 wherein the ultraviolet light curable ink jet ink further includes a second epoxy cationic reagent.

7. The method of claim 5 wherein the epoxy reagent is a monomer selected from the group consisting of bis-(3,4-epoxycyclohexyl)adipate, 1,4-butanediol diglycidylether, and neopentyl glycol diglycidylether.

8. The method of claim 1 wherein the ultraviolet light curable ink jet ink further comprises a rheology modifying additive including a hydroxy moiety.

9. The method of claim 8 wherein the rheology modifying additive is selected from the group consisting of stearyl alcohol and glyceryl behenate.

10. The method of claim 8 wherein the rheology modifying additive is a diol.

11. The method of claim 10 wherein the diol is selected from the group consisting of 1,12-stearyldiol, 1,10-decanediol, and a tallow glyceride.

12. The method of claim 1 wherein the photoinitiating system comprises an initiator and a UV sensitizer.

13. The method of claim 1, wherein the ultraviolet light curable ink jet ink has a Brookfield viscosity of between about 5 and about 45 centipoise at the printing temperature.

14. An ultraviolet light curable ink jet ink, the ultraviolet light curable ink jet ink having a Brookfield viscosity of between about 1 centipoise and about 50 centipoise at printing temperature, and between about 170 centipoise and about 500 centipoise at a shear rate of 20 s$^{-1}$ and at a temperature of about 20° C., the ultraviolet light curable ink jet ink comprising a colorant, a photoinitiating system, and a cationic reagent, wherein the cationic reagent is a chemical, which upon exposure to a UV irradiated cationic photoinitiating system, polymerizes, wherein the ultraviolet light curable ink jet ink, when cured, has an ASTN 3363 pencil hardness test value of at least 2H.

15. The ultraviolet light curable ink jet ink of claim 14 wherein the ultraviolet light curable ink jet ink has an ASTN 3363 pencil hardness test value of at least 4H.

16. The ultraviolet light curable ink jet ink of claim 14 wherein the cationic reagent is an epoxy reagent.

17. The ultraviolet light curable ink jet ink of claim 16 wherein the epoxy reagent is a monomer selected from the group consisting of bis-(3,4-epoxycyclohexyl)adipate, 1,4-butanediol diglycidylether, and neopentyl glycol diglycidylether.

18. The ultraviolet light curable ink jet ink of claim 16 wherein the ultraviolet light curable ink jet ink further includes a second epoxy cationic reagent.

19. The ultraviolet light curable ink jet ink of claim 14 wherein the ultraviolet light curable ink jet ink further comprises a rheology modifying additive including a hydroxy moiety.

20. The ultraviolet light curable ink jet ink of claim 19 wherein the rheology modifying additive is selected from the group consisting of stearyl alcohol and glyceryl behenate.

21. The ultraviolet light curable ink jet ink of claim 19 wherein the hydroxy moiety is a diol.

22. The ultraviolet light curable ink jet ink of claim 14 wherein the photoinitiating system comprises an initiator and a UV sensitizer.

23. The ultraviolet light curable ink jet ink of claim 14 comprising;
   about 60% to about 90% by weight of cationic reagent;
   about 3% to about 5% by weight of hydroxy containing rheology modifying additive; and
   about 10% to about 20% by weight of colorant.

24. The ultraviolet light ink jet ink of claim 14, wherein the ultraviolet light curable ink jet ink has a Brookfield viscosity of between about 5 and about 45 centipoise at the printing temperature.

25. A method of printing comprising:
   printing an ultraviolet light curable ink jet ink onto a substrate to provide a marking, the ultraviolet light curable ink jet ink having a Brookfield viscosity of between about 1 centipoise and about 50 centipoise at printing temperature, and between about 170 centipoise and about 500 centipoise at a shear rate of 20 s$^{-1}$ and at a temperature of about 20° C., the ultraviolet light curable ink jet ink comprising a colorant, a photoinitiating system, and a cationic reagent, wherein the cationic reagent is a chemical, which upon exposure to a UV irradiated cationic photoinitiating system, polymerizes, and wherein the ultraviolet light curable ink jet ink, when cured, has an ASTN 3363 pencil hardness test value of at least 4H; and then exposing the marking to ultraviolet radiation to cure the ultraviolet light curable ink jet ink in the marking.

26. The method of claim 25 wherein the substrate is a printed circuit board.

27. The method of claim 25 wherein the ultraviolet light curable ink jet ink is not exposed to ultraviolet radiation for at least 2 seconds.

28. The method of claim 25, wherein the ultraviolet light curable ink jet ink has a Brookfield viscosity of between about 5 and about 45 centipoise at the printing temperature.

29. An ultraviolet light curable ink jet ink composition, the ultraviolet light curable ink jet ink composition having a Brookfield viscosity of between about 1 centipoise and about 50 centipoise at printing temperature, and between about 170 centipoise and about 500 centipoise at a shear rate of 20 s$^{-1}$ and at a temperature of about 20° C., the ultraviolet light ink jet ink composition comprising a colorant, a cationic reagent, wherein the cationic reagent is a chemical, which upon exposure to a UV irradiated cationic photoinitiating system, polymerizes, a photoinitiating system, and a rheology modifier comprising a hydroxy moiety.

30. The ultraviolet light curable ink jet ink composition of claim 29 wherein the cationic reagent is an epoxy reagent.

31. The ultraviolet light curable ink jet ink composition of claim 30 wherein the ultraviolet light curable ink jet ink composition further includes a second epoxy cationic reagent.

32. The ultraviolet light curable ink jet ink composition of claim 29 wherein the hydroxy moiety is selected from the group consisting of stearyl alcohol and glyceryl behenate.

33. The ultraviolet light curable ink jet ink composition of claim 29 wherein the hydroxy moiety is a diol.

34. The ultraviolet light curable ink jet ink composition of claim 29 comprising;
    about 60% to about 90% by weight of cationic reagent;
    about 3% to about 5% by weight of hydroxy containing rheology modifying additive; and
    about 10% to about 20% by weight of colorant.

35. The ultraviolet light ink jet ink composition of claim 29, wherein the ultraviolet light curable ink jet ink has a Brookfield viscosity of between about 5 and about 45 centipoise at the printing temperature.

36. A method of printing comprising:
    printing an ultraviolet light curable ink jet ink onto a substrate to provide a marking, the ultraviolet light curable ink jet ink having a Brookfield viscosity of between about 1 centipoise and about 50 centipoise at printing temperature, and between about 170 centipoise and about 500 centipoise at a shear rate of 20 $s^{-1}$ and at a temperature of about 20° C., the ultraviolet light curable ink jet ink comprising a colorant, a photoinitiating system, a cationic reagent, wherein the cationic reagent is a chemical, which upon exposure to a UV irradiated cationic photoinitiating system, polymerizes, and a rheology modifying additive comprising a hydroxy moiety; and then
    exposing the marking to ultraviolet radiation to cure the ultraviolet light curable ink jet ink in the marking.

37. The method of claim 36 wherein the substrate is a printed circuit board.

38. The method of claim 36 wherein the ultraviolet light curable ink jet ink is not exposed to ultraviolet radiation for at least 2 seconds.

39. The method of claim 36, wherein the ultraviolet light curable ink jet ink has a Brookfield viscosity of between about 5 and about 45 centipoise at the printing temperature.

* * * * *